United States Patent
Asami et al.

(10) Patent No.: US 7,421,777 B2
(45) Date of Patent: Sep. 9, 2008

(54) METHOD OF MANUFACTURING MULTILAYER WIRING SUBSTRATE USING TEMPORARY METAL SUPPORT LAYER

(75) Inventors: Hiroshi Asami, Shizuoka (JP); Hidetoshi Kusano, Kanagawa (JP); Yuki Nishitani, Kanagawa (JP); Ken Orui, Kanagawa (JP)

(73) Assignee: Sony Corporation, Tokyo (JP)

( * ) Notice: Subject to any disclaimer, the term of this patent is extended or adjusted under 35 U.S.C. 154(b) by 340 days.

(21) Appl. No.: 11/063,131

(22) Filed: Feb. 22, 2005

(65) Prior Publication Data
US 2005/0142852 A1 Jun. 30, 2005

Related U.S. Application Data

(62) Division of application No. 10/403,550, filed on Mar. 31, 2003, now Pat. No. 7,288,724.

(30) Foreign Application Priority Data
Apr. 2, 2002 (JP) ............... 2002-099883

(51) Int. Cl.
*H05K 3/36* (2006.01)
(52) U.S. Cl. ............... 29/830; 29/831; 29/832; 29/852; 174/259; 156/247; 438/624
(58) Field of Classification Search ........... 29/830–832, 29/846, 851, 852; 174/255, 259, 261.262; 156/233, 235, 246, 247; 216/17; 257/686, 257/777; 361/746; 428/209; 438/761, 624
See application file for complete search history.

(56) References Cited

U.S. PATENT DOCUMENTS

| 5,111,003 | A | 5/1992 | Kimbara |
| 5,165,984 | A | 11/1992 | Schoenthaler |
| 5,281,151 | A | 1/1994 | Arima et al. |
| 5,428,190 | A | 6/1995 | Stopperan |
| 5,733,823 | A | 3/1998 | Sugioka et al. |
| 6,140,707 | A | 10/2000 | Plepys et al. |
| 6,373,000 | B2 * | 4/2002 | Nakamura et al. .......... 174/264 |
| 6,394,821 | B1 | 5/2002 | Matsumura et al. |

(Continued)

FOREIGN PATENT DOCUMENTS

JP 05-218603 8/1993

(Continued)

*Primary Examiner*—Donghai D. Nguyen
(74) *Attorney, Agent, or Firm*—Robert J. Depke; Rockey, Depke & Lyons, LLC

(57) ABSTRACT

The present invention provides a method of manufacturing a multilayer wiring substrate, which can preserve the dimensional stability of a conductor pattern at a fine pitch, solve the restriction on a process from the viewpoint of material selection, and further reduce a manufacturing cost, and a multilayer wiring substrate. A second wiring substrate formed on a supporting sheet made of metal and an adhesive layer are partially stacked on a predetermined region of a first wiring substrate by using the supporting sheet. After the lamination of the second wiring substrate, the supporting sheet is finally etched and removed. The second wiring substrate is stacked only on the portion required to be multilayered on the first wiring substrate to thereby reduce the amount of the construction material of the second wiring substrate.

6 Claims, 15 Drawing Sheets

U.S. PATENT DOCUMENTS

| | | |
|---|---|---|
| 6,506,978 B1 | 1/2003 | Furihata |
| 6,521,530 B2 | 2/2003 | Peters et al. |
| 6,591,491 B2 * | 7/2003 | Fujii et al. .................... 29/830 |
| 6,756,663 B2 | 6/2004 | Shiraishi et al. |
| 6,803,324 B2 * | 10/2004 | Ogawa et al. ............... 438/761 |

FOREIGN PATENT DOCUMENTS

| | | |
|---|---|---|
| JP | 07-202424 | 8/1995 |
| JP | 09-135081 | 5/1997 |
| JP | 10-107445 | 4/1998 |
| JP | 2000-353765 | 12/2000 |
| JP | 2001-237549 | 8/2001 |
| JP | 2001-267747 | 9/2001 |

* cited by examiner

F I G. 1 4 A
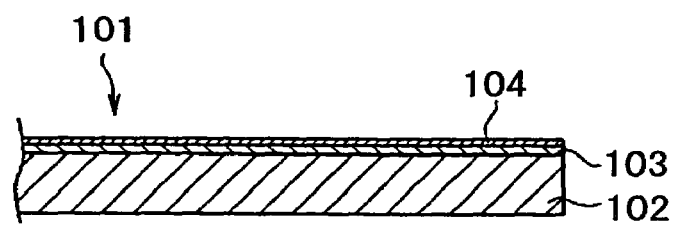
F I G. 1 4 B
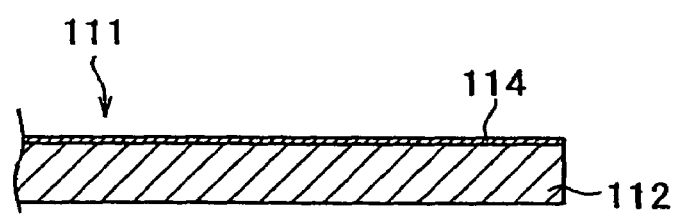
F I G. 1 4 C
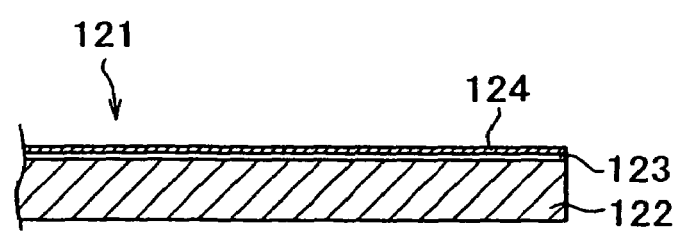

METHOD OF MANUFACTURING MULTILAYER WIRING SUBSTRATE USING TEMPORARY METAL SUPPORT LAYER

The subject matter of application Ser. No. 10/403,550 is incorporated herein by reference. The present application is a divisional of U.S. application Ser. No. 10/403,550, filed Mar. 31, 2003, issued as U.S. Pat. No. 7,288,724 which claims priority to Japanese Patent Application No. JP2002-099883, filed Apr. 2, 2002. The present application claims priority to these previously filed applications.

BACKGROUND OF THE INVENTION

1. Field of the Invention

The present invention relates to a method of manufacturing a multilayer wiring substrate in which two or more wiring substrates are stacked on each other, and a multilayer wiring substrate.

2. Description of Related Art

In association with the miniaturization and the usage of multiple functions in electronic apparatuses, the request for higher density of wiring substrates (printed circuit boards) and miniaturization of mounted parts are becoming increasingly restrictive. In the wiring substrate, the higher density in a direction parallel to a substrate surface has been conventionally tried by reducing a wiring rule. However, in recent years, the higher density in a direction vertical to the surface of the wiring substrate has been advanced by employing a buildup process, stacking the wiring substrates, and forming via holes (interlayer connections) to electrically connect any layers to each other.

As this type of a conventional technique, for example, Japanese Laid Open Patent Application (JP-A-Heisei, 10-107445) discloses a method of manufacturing a multilayer wiring substrate, which forms a conductor pattern (a wiring pattern) on a wiring substrate by using a transferring method. The conventional method of manufacturing a multilayer wiring substrate will be described below with reference to FIGS. 15A to 15E.

At first, as shown in FIG. 15A, a wiring substrate in which a first conductor pattern 2 is formed on a surface of an insulator 1 is produced or prepared. Then, as shown in FIG. 15B, an insulating layer 3 is formed by coating insulation slurry on the surface of the insulator 1. Next, as shown in FIG. 15C, via holes 4 linked to the first conductor pattern 2 are formed in the insulating layer 3 by using laser machining and the like, and a conductive paste 5 is filled in the formed via holes 4. In succession, as shown in FIG. 15D, a second conductor pattern 6 previously formed on a transfer sheet 7 is transferred onto the insulating layer 3. The first and second conductor patterns 2, 6 are connected through the conductive paste 5.

The transfer sheet 7 is mainly made of synthetic resin material such as polyethylene terephthalate (PET) and the like. The conductor pattern 6 is formed by patterning a conductor layer put or deposited on this transfer sheet 7 to a predetermined shape by using a wet etching method. The transfer of the conductor pattern 6 to the insulating layer 3 from the transfer sheet 7 is carried out by using the differences in adhesion between the conductor pattern 6 and the insulating layer 3 and between the conductor pattern 6 and the transfer sheet 7.

When three or more conductive layers are formed, the processes similar to the above-mentioned case are repeated. In short, as shown in FIG. 15E, an insulating layer 8 is further formed on the insulating layer 3. Via holes are formed in this insulating layer 8, and a conductive paste 10 is filled in the formed via holes. After that, a third conductor pattern 11 is formed by the transferring method.

As mentioned above, in the case of the multilayer wiring substrate manufactured by the transferring method, the via holes for the connection between the layers are formed in any portions of the insulating layer. Consequently, the multilayer can be easily attained.

However, in the case of the above-mentioned conventional method of manufacturing the multilayer wiring substrate, the transfer sheet 7 is mainly made of the resin film. Thus, this method has a problem that the expansion/contraction and the warp of the transfer sheet 7 occurring at a time of handling cause an error to be easily induced in the pattern shapes (the dimensions) of the transferred conductor patterns 6, 11. Thus, in this conventional method of manufacturing the multilayer wiring substrate, it will be very difficult to cope with the hyperfine structure (fine pitch structure) of the conductor patterns expected to continue to evolve in the future. Hence, it is impossible to obtain the multilayer wiring substrate of a high quality which corresponds to the fine pitch structure.

By the way, the transfer sheet is thought to be made of metal material such as stainless steel and the like. In this case, as compared with the case in which the transfer sheet is made of the resin film, a rigidity of the transfer sheet is increased to thereby improve the dimensional stability of the conductor pattern. However, in this case, if the rigid property of the transfer destination is strong, it is difficult to remove the transfer sheet. Thus, this method has a problem that the operation for transferring the conductor pattern is not able to be properly done.

Also, in the case of the conventional method of manufacturing the multilayer wiring substrate, the process for producing the multilayer is the steps of alternately stacking the insulating layer and the conductive layer by one layer at a time. For example, if any step defect occurs in the upper layer, all of the steps until that time become vain, and the entire wiring substrate is treated as a defect. Thus, the conventional method of manufacturing the multilayer wiring substrate has a problem that its productivity is poor and its yield is low.

Moreover, the conventional method of manufacturing the multilayer wiring substrate is designed so as to form the insulating layers 3, 8 on the entire surface of a bedding layer when producing the multilayer. Thus formed insulating layers 3, 8 need to be baked and cured. Thus, the conventional method must impose a certain limit on the selection for the construction materials of the insulating layers 3, 8, in order to protect the miss match of a baking temperature. Consequently, this method has a problem that the degree of the freedom of the board design becomes low.

On the other hand, when the board design is carried out for producing the multilayer only in a partial region on the bedding substrate and improving the wiring density, the conventional manufacturing process needs to uniformly form the insulating layers even in the other regions on the bedding substrate. Thus, the conventional method also has a problem that the burden of a material cost when an expensive material is used for the insulating layer is increased.

As mentioned above, the conventional method of manufacturing the multilayer wiring substrate has the problems that it is difficult to cope with the finer pitch structure of the conductor pattern and that the restriction on the material selection is always accompanied and that the producing cost or the material cost is expensive.

SUMMARY OF THE INVENTION

The present invention is accomplished in view of the above mentioned problems. Accordingly, there has been a need to provide a method of manufacturing a multilayer wiring substrate, which can preserve the dimensional stability in a conductor pattern of a fine pitch and remove the restriction on a process from the viewpoint of material selection and further reduce a manufacturing cost, and a multilayer wiring substrate.

In order to solve the above-mentioned problems, a method of manufacturing a multilayer wiring substrate according to the present invention is a method of manufacturing a multilayer wiring substrate, in which a first wiring substrate having a first conductor pattern and a second wiring substrate having a second conductor pattern are stacked on each other, including the steps of: forming the second wiring substrate on a supporting sheet made of metal; forming an adhesive layer on the formed second wiring substrate; forming an interlayer connection linked to the second conductor pattern, for the adhesive layer; stacking the second wiring substrate through the adhesive layer on a predetermined region of the first wiring substrate, and electrically connecting the interlayer connection and the first conductor pattern; and removing the supporting sheet from the second wiring substrate.

In the present invention, the first wiring substrate and the second wiring substrate are formed independently of each other. The second wiring substrate is formed on the supporting sheet made of metal. The adhesive layer is formed on the second wiring substrate, and that interlayer connection and the second conductor pattern are electrically connected. After that, the second wiring substrate is stacked through the adhesive layer on the predetermined region of the first wiring substrate. At this time, the supporting sheet functions as the support to maintain the flatness of the second wiring substrate, and the supporting sheet is removed after both of the substrates are stacked. Consequently, even if the first and second wiring substrates are made of materials different from each other, they can be stacked on each other. Thus, the restriction on the process from the viewpoint of material selection is solved.

The method of manufacturing the multilayer wiring substrate, according to the present invention, is preferable when the second wiring substrate is made of the material relatively weak in rigid property and in self-support property. The supporting sheet made of the metal can maintain the flatness of the second wiring substrate and the adhesive layer. Thus, the dimensional stability of the second conductor pattern and the interlayer connection can be preserved to properly stack on the first wiring substrate.

Also, the present invention is designed so as to stack the second wiring substrate on the predetermined region of the first wiring substrate. Thus, the second wiring substrate can be formed smaller in area than the first wiring substrate. Hence, the material cost can be reduced.

On the other hand, another method of manufacturing a multilayer wiring substrate according to the present invention includes the steps of: forming an adhesive layer on a supporting sheet made of metal; forming a conductive interlayer connection for linking between the layers for the adhesive layer; stacking the second wiring substrate on the adhesive layer and electrically connecting the interlayer connection and the second conductor pattern; removing the supporting sheet from the adhesive layer; and stacking the second wiring substrate through the adhesive layer on a predetermined region of the first wiring substrate, and electrically connecting the interlayer connection and the first conductor pattern.

Also in the present invention, the first wiring substrate and the second wiring substrate are formed independently of each other. The second wiring substrate is formed on the supporting sheet through the adhesive layer. Then, the second wiring substrate is stacked on the predetermined region of the first wiring substrate after the removal of the supporting sheet.

The present invention is preferably applied to a case when the second wiring substrate is made of the material that is relatively strong in rigid property and self-support property.

On the other hand, the multilayer wiring substrate according to the present invention is characterized in that it is a multilayer wiring substrate, in which a first wiring substrate and a second wiring substrate electrically connected to the first wiring substrate are stacked on each other, wherein the second wiring substrate is partially stacked on a predetermined region of the first wiring substrate.

According to the present invention, the second wiring substrate can be formed smaller in area than the first wiring substrate. Thus, as compared with the case in which the second wiring substrate is formed on the entire surface of the first wiring substrate, the usage amount of the construction material of the second wiring substrate can be reduced to thereby reduce the material cost. Moreover, the multilayer wiring substrate can be entirely lightened.

BRIEF DESCRIPTION OF THE DRAWINGS

FIGS. 4A to 6I shows sectional views explaining the method of manufacturing the multilayer wiring substrate in the first embodiment of the present invention at each step, wherein
FIG. 4A shows a step of preparing a supporting sheet;
FIG. 6I shows a step of removing a supporting sheet;

FIGS. 10A to 12J shows sectional views explaining the method of manufacturing the multilayer wiring substrate in the second embodiment of the present invention at each step, wherein
FIG. 10A shows a step of preparing a supporting sheet;
FIG. 12J shows a stacking step;
FIGS. 14A to 14C are sectional diagrammatic views of a supporting sheet to explain a variation of the configuration of the supporting sheet according to the present invention.

DETAILED DESCRIPTION OF THE PREFERRED EMBODIMENTS

The respective embodiments of the present invention will be described below with reference to the attached drawings.

First Embodiment

Figure 1:
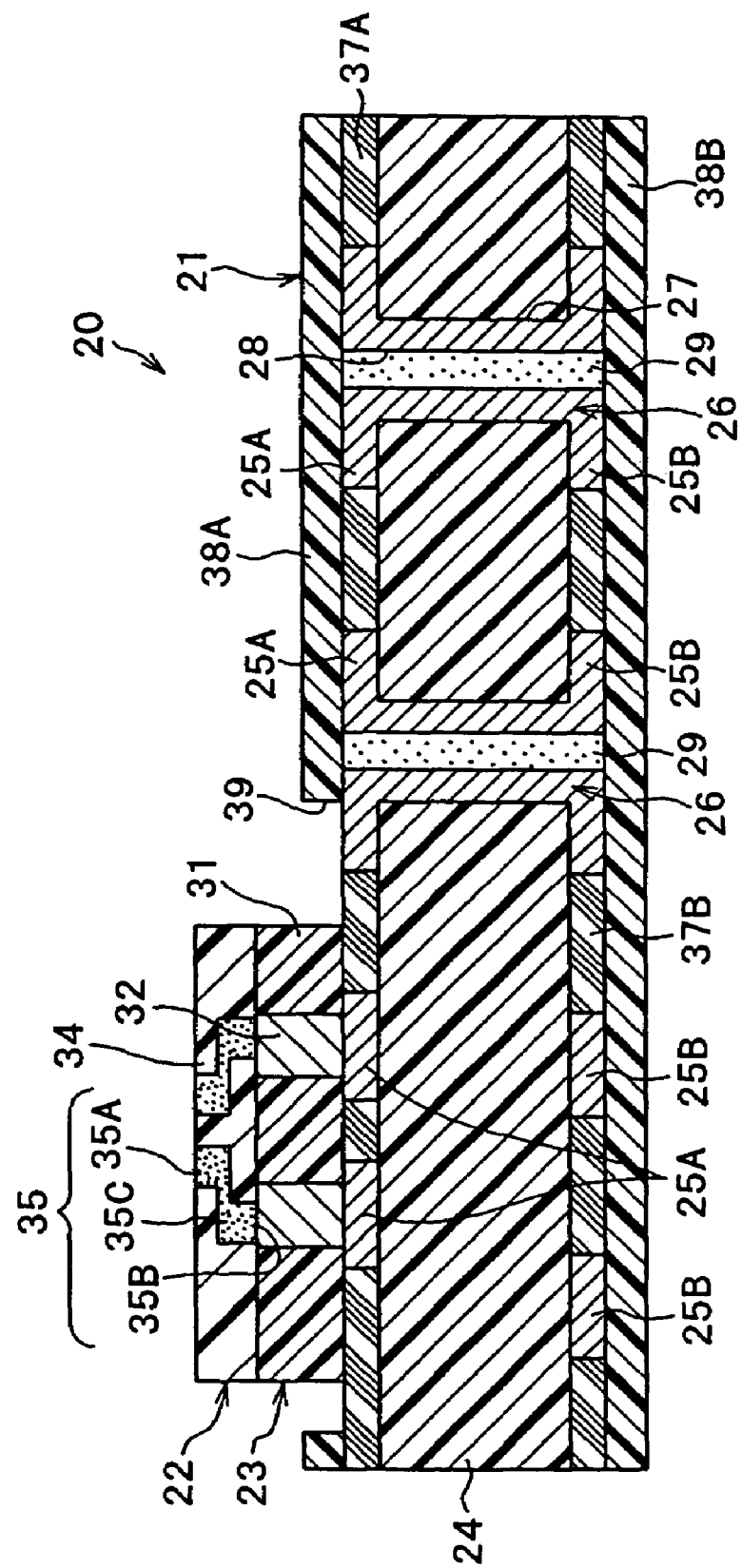
FIG. 1 is a sectional view diagrammatically showing a configuration of a main portion of a multilayer wiring substrate according to a first embodiment of the present invention.

FIG. 1 shows a configuration of a multilayer wiring substrate according to the first embodiment of the present invention. A multilayer wiring substrate 20 in this embodiment is provided with a first wiring substrate 21, a second wiring substrate 22, and an adhesive material layer 23 placed between those first and second wiring substrates 21, 22.

The first wiring substrate 21 in this embodiment is made of, for example, double-side copper-clad stack, and it includes: an insulator base material 24 serving as an insulating layer; and conductor patterns 25A, 25B (corresponds to a first conductor pattern of the present invention) formed by patterning copper foils on the double sides to predetermined shapes. By the way, Ni/Au (Nickel/Gold) plating layers may be formed on surface layers of the conductor patterns 25A, 25B.

The construction material of the insulator base material 24 is suitably selected depending on an application target, a use application and the like. For example, it is made of organic material, such as glass epoxy resin (element in which epoxy resin is impregnated in fiber glass), element in which polyimide resin is impregnated in fiber glass, BT resin (Brand Name) in which mixture of bismale-imide-triazine resin and epoxy resin is impregnated in fiber glass, element in which phenol resin is impregnated in paper, and the like. However, besides them, it can be made of ceramic-based material, such as alumina or glass inclusion ceramics, aluminum nitride, and the like.

The conductor patterns 25A, 25B are partially electrically connected to each other via through-bores 26. The through-bore 26 is composed of a through-bore 27 formed in the insulator base material 24 and a copper plating 28 formed on the inner wall plane thereof. By the way, a filler 29 made of conductive material or non-conductive material is filled in the through-bore 26.

The regions in which the conductor patterns 25A, 25B on the top and bottom surfaces of the insulator base material 24 are not formed are covered with layers of insulating materials 37A, 37B, and the step on the insulator base material 24 caused by the formations of the conductor patterns 25A, 25B is removed. Consequently, the lamination plane of the first wiring substrate 21 is flattened to thereby preserve the proper lamination condition with the second wiring substrate 22.

Moreover, outer surfaces of the first wiring substrate 21 formed by the conductor patterns 25A, 25B and the insulating materials 37A, 37B are coated by solder resists 38A, 38B. However, the region on which the second wiring substrate 22 is stacked is exposed through an opening 39 toward the outside.

Figure 2A:
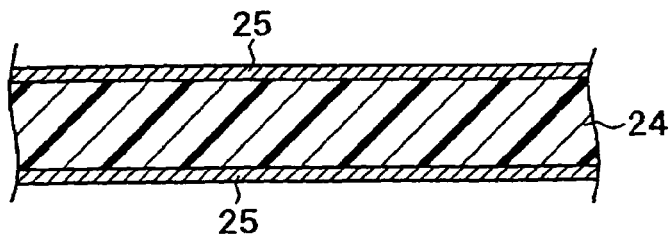
FIGS. 2A to 2E are sectional views explaining an example of a method of manufacturing a first wiring substrate in the multilayer wiring substrate in the first embodiment of the present invention at each step.
Figure 2B:
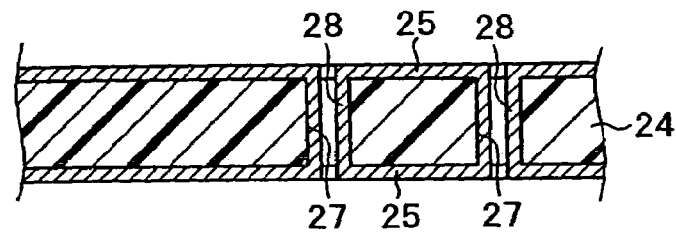
Figure 2C:
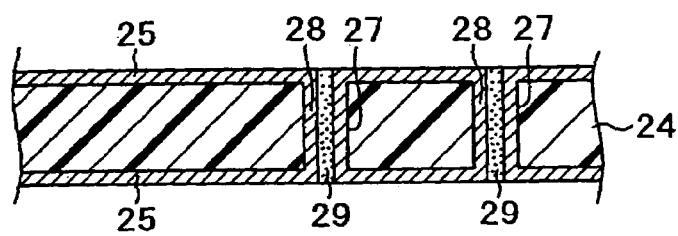
Figure 2D:
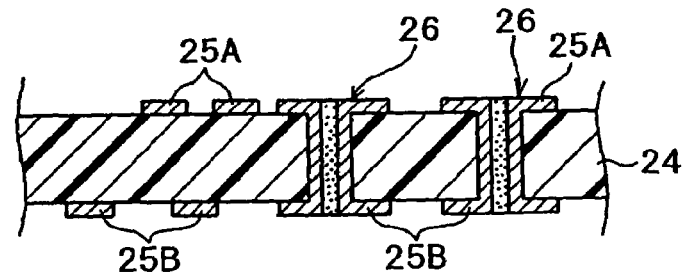
Figure 2E:
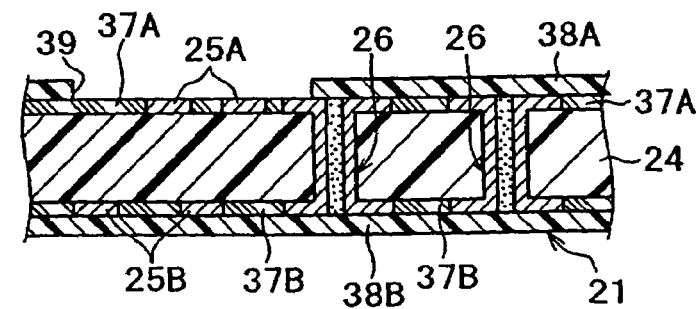

FIGS. 2A to 2E show an example of the process for producing the first wiring substrate 21. At first, the through-bores 27, 27 are formed in predetermined portions of the previously prepared double-side copper-clad stack by using a micro drill and the like. Moreover, the copper plating 28 is formed on the inner wall plane of the through-bore 27 (FIGS. 2A, 2B). Next, the filler 29 is filled in the through-bore 27, and copper foils 25, 25 are patterned to predetermined shapes to thereby form the conductor patterns 25A, 25B (FIGS. 2C, 2D). Then, the portions on the insulator base material 24 on which the conductor patterns 25A, 25B are not formed are coated with the insulating materials 37A, 37B. After that, the solder resists 38A, 38B are formed on the double sides (FIG. 2E). The first wiring substrate 21 in this embodiment is formed as mentioned above.

With reference to FIG. 1, the second wiring substrate 22 itself is constituted as the multilayer substrate, and it has a conductor pattern (corresponds to a second conductor pattern of the present invention) 35. As shown, the second wiring substrate 22 is formed smaller in area than the first wiring substrate 21. It is partially stacked on a predetermined portion on the first wiring substrate 21 through the adhesive material layer 23. In this embodiment, the above-mentioned predetermined portion designates the region required to be multilayered (higher wiring density) on the first wiring substrate 21.

An insulator base material 34 serving as an insulating layer is made of photosensitive resin material having high resolution, for example, poly-benzo-oxadole (PBO), benzo-cyclobutene, photosensitive polyimide, and the like.

The conductor pattern 35 is formed by a damascening method widely used in a micro wiring forming process for a semiconductor device, and it is composed of: conductor lands 35A, 35B exposed on the top and bottom surfaces of the insulator base material 34; and an inner wiring layer 35C through which they are connected. By the way, the conductor pattern 35 may be formed, for example, by using a semi-additive method besides the damascening method.

The conductor land 35A on the top side of the insulator base material 34 is formed at a pitch narrower than that of the conductor land 35B on the bottom side (the side of the first wiring substrate 21). Although this is not shown, a semiconductor chip can be installed on the second wiring substrate 22 in the well known manner such as a flip chip mount or a wire bonding connection or the like. In this case, an arrangement pitch between the conductor lands 35A is defined correspondingly to a bump pitch of the semiconductor chip. In short, the second wiring substrate 22 is designed so as to be able to function as an interposer substrate when the semiconductor chip is mounted on the first wiring substrate 21.

Now, the second wiring substrate 22 is stacked through the adhesive material layer 23 on the first wiring substrate 21. The adhesive material layer 23 is composed of an interlayer insulating layer 31 and a plurality of conductive interlayer connections 32. The interlayer connection 32 penetrates a predetermined portion of the interlayer insulating layer 31 and electrically connects the conductor pattern 25A of the first wiring substrate 21 and the conductor pattern 35 of the second wiring substrate 22.

Here, the interlayer insulating layer 31 constituting the adhesive material layer 23 is made of, for example, photosensitive adhesive. The interlayer connection 32 is formed at that predetermined portion by filling conductive material in the holes made by using a photolithography technique. In this embodiment, the interlayer connection 32 is composed of an electroplating layer of copper (Cu). However, besides this, it can be composed of other metals such as nickel (Ni), tin (Sn), and the like.

The multilayer wiring substrate 20 in this embodiment is configured as mentioned above. According to the multilayer wiring substrate 20 in this embodiment, the first wiring substrate 21 and the second wiring substrate 22 are configured so as to be stacked on each other through the adhesive material layer 23. Thus, although the respective insulator base materials 24, 34 are made of different materials, they can be easily stacked to thereby attain the multilayer.

For example, the insulator base material of the first wiring substrate is made of glass epoxy resin, and the insulator base material of the second wiring substrate is made of benzo-cyclobutene. The benzo-cyclobutene is a low dielectric material and suitable for the base material for a high frequency circuit. The thus-configured first and second wiring substrates are stacked to thereby give the performance of the second wiring substrate to the necessary region on the first wiring substrate. Hence, it is possible to obtain the multilayer wiring substrate that can attain a systematic function.

Also, the multilayer wiring substrate 20 in this embodiment is designed such that the second wiring substrate 22 is partially stacked on the predetermined region of the first wiring substrate 21, as shown in FIG. 1. Thus, the multilayer can be formed only in the originally required region. Consequently, the area of the second wiring substrate 22 can be decreased to thereby reduce the material cost. Moreover, the multilayer wiring substrate can be entirely carried out weight-saving.

The method of manufacturing the multilayer wiring substrate 20 in this embodiment will be described below with reference to FIGS. 3A to 7. Here, FIGS. 3A to 3H are sectional views explaining the method of manufacturing the second wiring substrate 22 at each step, FIGS. 4A to 6I are sectional views explaining the method of manufacturing the multilayer wiring substrate 20 at each step, and FIG. 7 is a process flowchart explaining the method of manufacturing the multilayer wiring substrate 20.

Figure 4A:
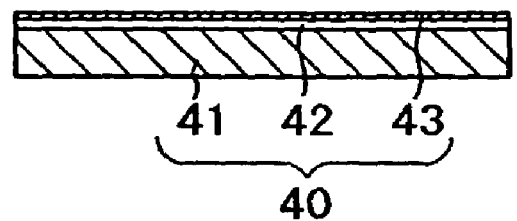

At first, a supporting sheet 40 having the configuration diagrammatically shown in FIG. 4A is prepared. The supporting sheet 40 provides the three-layer structure composed of: a metal base member 41 which is made of copper and has a thickness of, for example, about 100 μm; a conductive adhesive resin layer 42; and a melting metal layer 43 which is made of chrome (Cr) and has a thickness of, for example, 5 μm or less. The metal base member 41 and the melting metal layer 43 can be separated (stripped) from each other through the conductive adhesive resin layer 42.

The metal base member 41 occupies the main portion of the total thickness of the supporting sheet 40, and it is mainly configured so as to have the mechanical property, such as a strength and the like, which is required at the time of the handling, and the material property such as a heat-resistive temperature and the like. The conductive adhesive resin layer 42 is made of the material which enables the preservation of the electric continuity between the metal base member 41 and the melting metal layer 43 and also enables both of them to be separated and removed. For example, the benzo-triazole formed in the shape of layer is applied. The melting metal layer 43 is made of metal foil and metal plating layer and also made of a metal material different from the interlayer connection 32 so that it can be selectively etched from the interlayer connection 32 of the adhesive material layer 23.

By the way, the configuration example in which the metal base member 41 and the melting metal layer 43 are separated and removed from each other is not limited to the above-mentioned example. Other configuration examples can be employed. However, their detailed explanations will be described later.

Figure 3A:
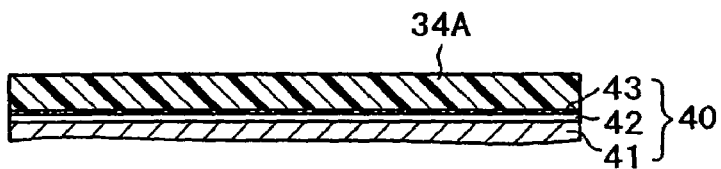
FIGS. 3A to 3H are sectional views explaining an example of a method of manufacturing a second wiring substrate in the multilayer wiring substrate in the first embodiment of the present invention at each step.
Figure 3B:
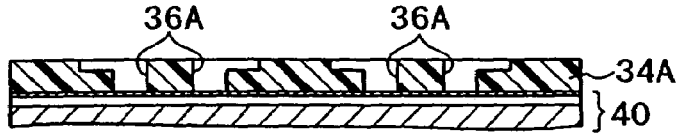
Figure 3C:
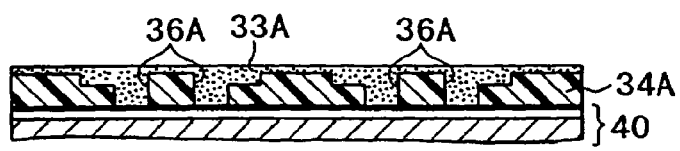
Figure 3D:
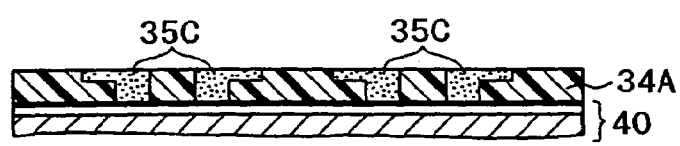
Figure 3E:
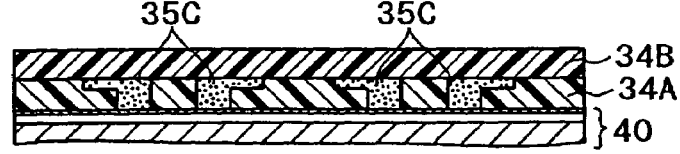
Figure 3F:
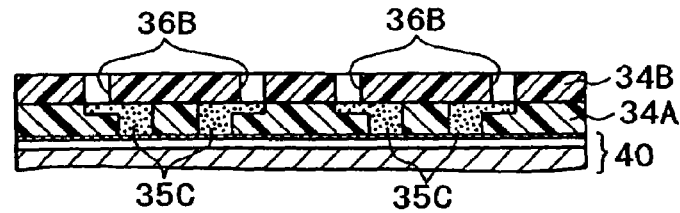
Figure 3G:
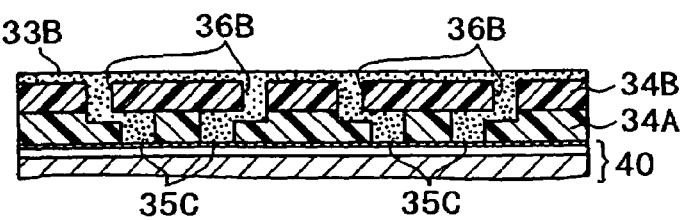
Figure 3H:
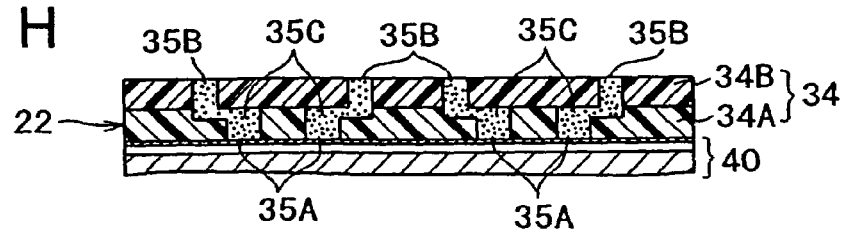
Figure 4B:
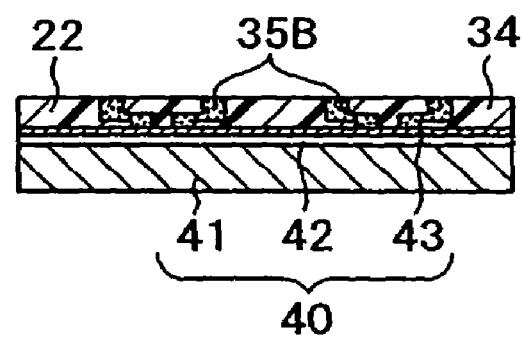
FIG. 4B shows a step of forming a second wiring substrate.

Next, the second wiring substrate 22 is formed on the side surface of the melting metal layer 43 of the supporting sheet 40 in step S11 of FIG. 4B. Here, FIGS. 3A to 3H show the process for manufacturing the second wiring substrate 22. The second wiring substrate 22 is formed, for example, by the dual damascening method that uses the poly-benzo-oxadole (PBO) of positive photosensitive material, and the like as the insulating layer.

As shown in FIG. 3A, the photosensitive material made of the poly-benzo-oxadole is coated on the side surface of the melting metal layer 43 of the supporting sheet 40 by using a spin coating method and the like. Then, a predetermined baking process is carried out to thereby form an insulating layer 34A. Next, exposing light is irradiated through a mask (not shown) to a predetermined region of the formed insulating layer 34A. Then, a developing process is carried out to thereby form an opening 36A as shown in FIG. 3B. The opening 36A constitutes the via holes for the connection between the layers and a part of the wiring layer. The exposure depths are differed by a two-stage exposure.

Next, as shown in FIG. 3C, an electroplating layer 33A made of, for example, copper is formed on the insulating layer 34A containing the inside of the opening 36A. At this time, a sputter barrier layer such as Ti/Cu and the like may be formed between the inner wall plane of the opening 36A and the electroplating layer 33A. The electroplating layer 33A is removed from the surface of the insulating layer 34A, for example, by using a CMP (Chemical Mechanical Polishing) method and the like as shown in FIG. 3D.

Next, the same kind of the photosensitive material (the poly-benzo-oxadole) is again coated on the insulating layer 34A by the spin coating method, and the predetermined baking process is carried out to thereby form an insulating layer 34B as shown in FIG. 3E. The exposing light is irradiated to a predetermined region of the formed insulating layer 34B, and an opening 36B linked to the inner wiring layer 35C is formed as shown in FIG. 3F. Then, an electroplating layer 33B similarly made of copper is formed on the insulating layer 34B containing the inside of the opening 36B as shown in FIG. 3G. The electroplating layer 33B is removed from the surface of the insulating layer 34B by the CMP method and the like to thereby form the inner wiring layer 35C containing the conductor lands 35A, 35B as shown in FIG. 3H.

As mentioned above, the second wiring substrate 22 is formed on the supporting sheet 40. The second wiring substrate 22 in this embodiment has the wiring pattern with the super fine structure and the high precision, since the photosensitive resin material with the high resolution is used as the insulating layer, and the dual damascening method used in the wiring forming process of the semiconductor device is used for it to thereby form the conductor pattern.

Also, the thickness of the insulator base material 34 is several 10 μm. The rigid property or the self-support property is weak to an extent that it is difficult for only the insulator base material 34 to maintain a predetermined flatness. For this reason, the insulator base material 34 needs to be supported by the supporting sheet 40 during the process and handled through the supporting sheet 40. However, the supporting sheet 40 is made of metal. Thus, the flatness of the insulating layers 34A, 34B can be properly maintained. Moreover, it has the heat resistance property at which the dimensional change is never induced even at a baking temperature (for example, 300° C.) of the insulating layers 34A, 34B. Also, the conductor pattern 35 can be formed by using the electroplating method. Hence, the super fine conductor pattern can be formed at the extremely high precision.

Figure 4C:
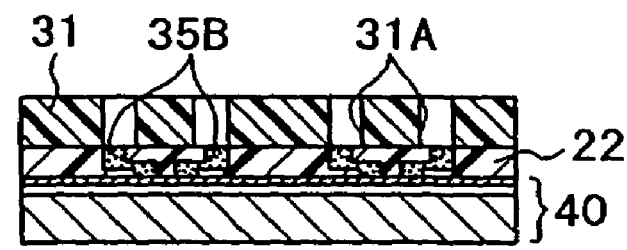
FIG. 4C shows a step of forming an adhesive layer.
Figure 5D:
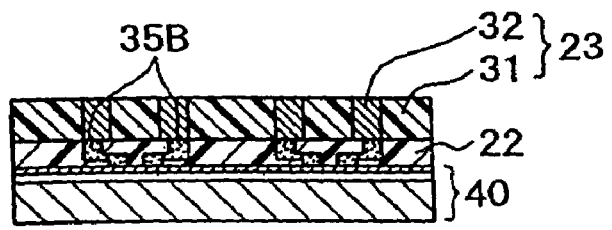
FIG. 5D shows a step of forming an interlayer connection.
Figure 6G:
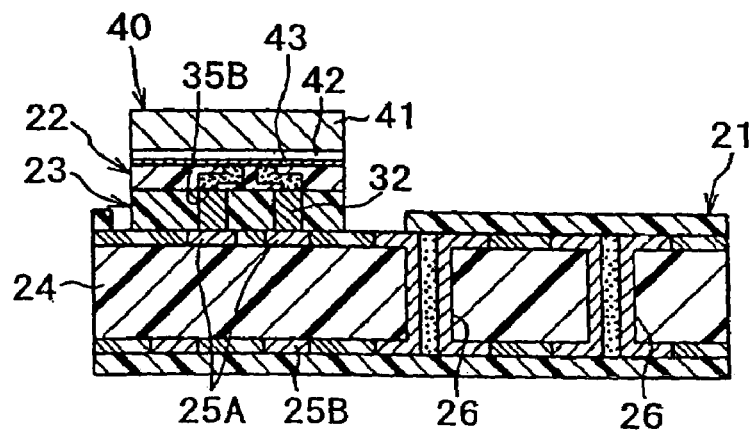
FIG. 6G shows a stacking step.

Now, returning back to FIGS. 4A to 4C, the photosensitive adhesive constituting the interlayer insulating layer 31 of the adhesive material layer 23 is coated on the second wiring substrate 22 formed on the supporting sheet 40 in step S12. The exposing and developing processes are performed thereon to thereby form a through-bore 31A linked to the conductor land 35B of the second wiring substrate 22 in step S13 of FIG. 4C. Then, as shown in FIG. 5D, the supporting sheet 40 is used as a seeding layer (electric power supplying layer), and the electroplating process is carried out. The electroplating layer made of, for example, copper is filled in the through-bore 31A to thereby form the interlayer connection 32 in step S14. By the way, the photosensitive adhesive is not limited to the liquid type, and a sheet type may be used.

As mentioned above, the adhesive material layer 23 composed of the interlayer insulating layer 31 and the interlayer connection 32 is formed on the second wiring substrate 22.

In this embodiment, as mentioned above, the interlayer connection 32 is formed by the electroplating method. Moreover, at this step, the power distribution inspection of the second wiring substrate 22 can be carried out at the same time. In short, the interlayer connection 32 is electrically connected through the second wiring substrate 22 to the supporting sheet 40. Thus, as for the through-bore 31A on which the electroplating layer is not deposited as shown in FIG. 4C, it can be judged that the conductor pattern 35 of the second wiring substrate 22 at that portion is cut away. Consequently, the wiring inspection of the conductor pattern 35 can be carried out without using an expensive inspecting apparatus and the like.

Also, this embodiment is designed such that the interlayer connection 32 is formed by the electroplating method. At this time, the previously formed interlayer insulating layer 31 can be used as resist for plating. Consequently, the conductor layer can be homogeneously formed on the insides of the respective through-bores 31A made at micro pore size. Also, the interlayer connection 32 can be formed at the fine pitch.

Typically, since an electroplating bath is acid, the interlayer insulating layer 31 made of the resin is never deteriorated in the plating bath. Thus, as described later, after the formation of the interlayer connection 32, the interlayer insulating layer 31 can be used as the adhesive layer between the first and second wiring substrates 21, 22.

By the way, this is not limited to the configuration that the interlayer connection 32 is entirely made of copper. For example, only the surface layer may be composed of the electroplating layer of tin (Sn). In this case, if the surface layer of the conductor pattern 25A of the first wiring substrate 21 is a gold plating layer, the connection of lamination boundary can be attained by Sn-Au junction. Thus, it is possible to attain the lower temperature and the smaller load in the stacking step.

Figure 5E:
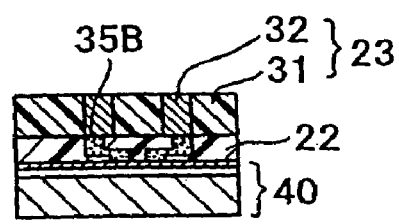
FIG. 5E shows a dicing step.

Next, a dicing step of cutting the second wiring substrate 22 together with the adhesive material layer 23 and the supporting sheet 40 to the piece of the size corresponding to the lamination on the first wiring substrate 21 is carried out in step S15 of FIG. 5E.

Figure 5F:
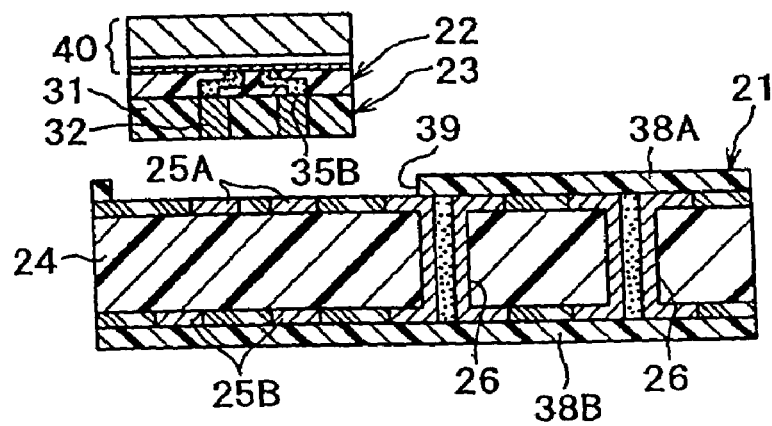
FIG. 5F shows a stacking step.

After that, as shown in FIG. 5F, the supporting sheet 40 is reversed such that the respective interlayer connections 32 of the adhesive material layer 23 are opposite to the conductor pattern 25A on the first wiring substrate 21. Then, the second wiring substrate 22 is stacked on the predetermined portion (an opening 39A of the solder resist 38A) of the first wiring substrate 21 through the adhesive material layer 23 so that the interlayer connections 32 and the conductor pattern 25A are electrically connected in Step S16 of FIG. 6G. Thus, the conductor patterns 25A, 35 of the first and second wiring substrates 21, 22 are electrically connected.

Here, in this embodiment, the supporting sheet 40 for supporting the second wiring substrate 22 is made of the metal. Thus, the stacking process on the first wiring substrate 21 can be carried out in the condition that the second wiring substrate 22 is maintained at the predetermined flatness. Consequently, it is possible to properly connect to the conductor pattern 25A on the first wiring substrate 21 while preserving the dimensional stability of the interlayer connection 32 of the adhesive material layer 23 and the conductor pattern 35 of the second wiring substrate 22.

By the way, the thermosetting condition of the adhesive material layer 23 is determined depending on the construction material of the insulator base material 24 in the first wiring substrate 21. Thus, the construction material of the adhesive material layer 23 is selected depending on the construction material in the insulator base material 24. For example, if the first wiring substrate 21 is made of FR-4 (Brand Name) substrate, the above-mentioned stacking step is carried out under the heating and compressed condition of, for example, 160° C.×10 s.

Figure 6H:
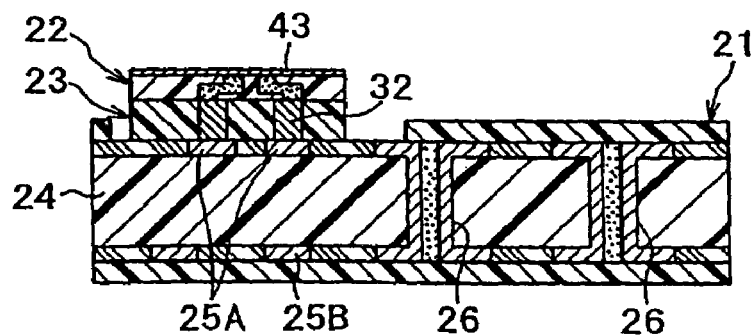
FIG. 6H shows a step of removing a supporting sheet.
Figure 6I:
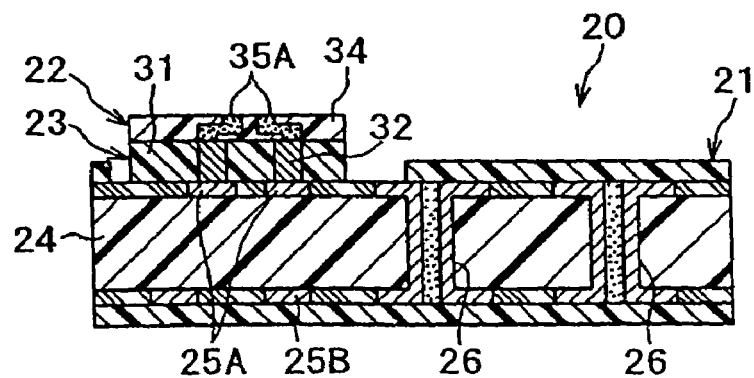
Figure 7:
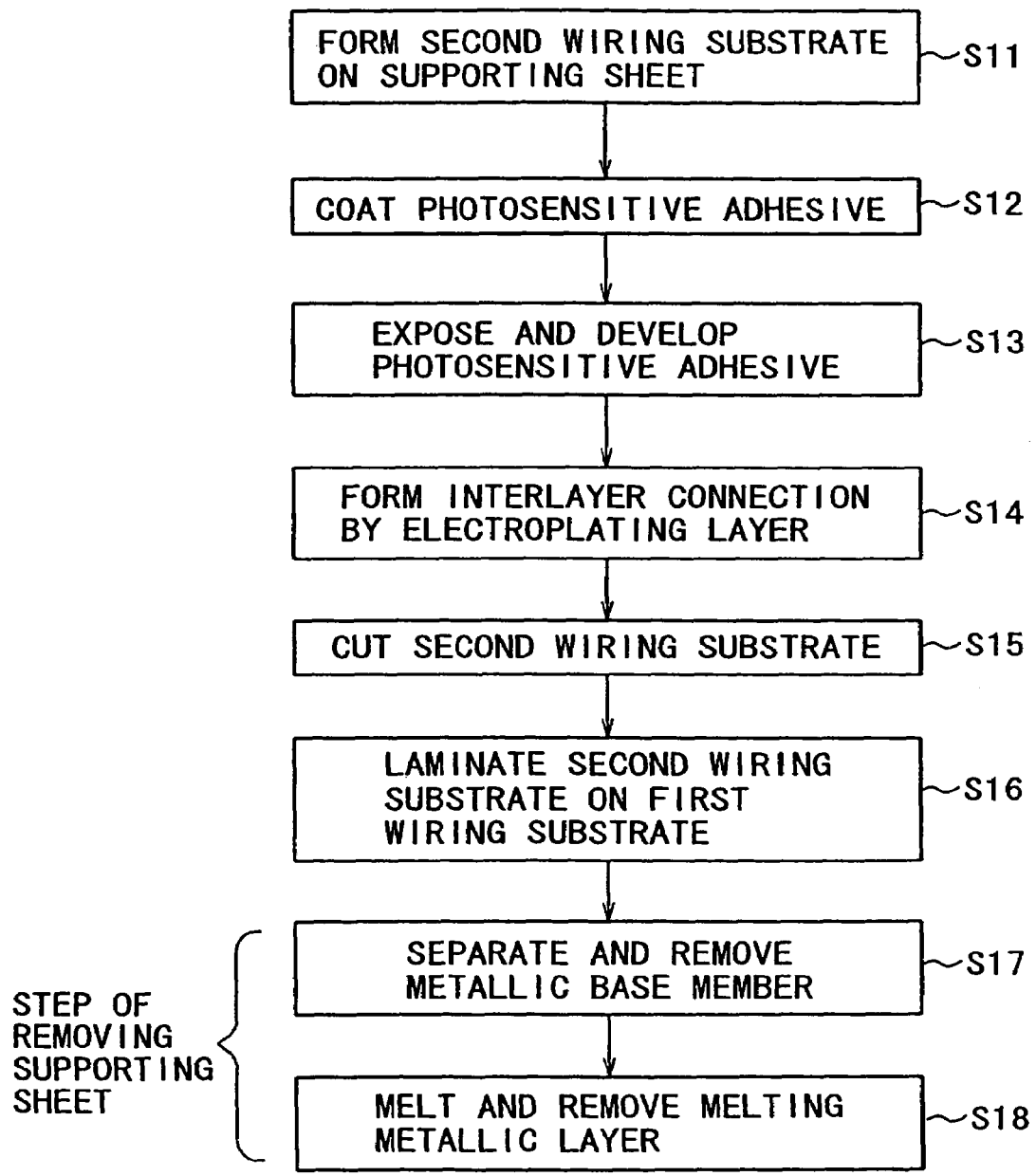
FIG. 7 is a flowchart explaining the method of manufacturing the multilayer wiring substrate in the first embodiment of the present invention.

Next, as shown in FIGS. 6H, 6I, a step of removing the supporting sheet 40 from the second wiring substrate 22 is carried out in steps S17, S18. The removal of the supporting sheet 40 is constituted by a step of separating and removing the metal base member 41 from the melting metal layer 43 in step S17 of FIG. 6I and a step of melting and removing the melting metal layer 43 in step S18 of FIG. 6I.

With reference to FIGS. 6G, 6H, the step of separating and removing the metal base member 41 from the melting metal layer 43 is carried out by stripping the metal base member 41 from the melting metal layer 43 through the conductive adhesive resin layer 42 in step S17. By the way, in order to separate the conductive adhesive resin layer 42 together with the metal base member 41 from the melting metal layer 43, mold releasing agent may be coated on a predetermined portion on the side surface of the melting metal layer 43.

The removal of the metal base member 41 can be easily done, for example, by inserting the notch for stripping into the boundary between the melting metal layer 43 and the metal base member 41 at the edge of the supporting sheet 40. Also, during the process for stripping the metal base member 41, the melting metal layer 43 is supported by the second wiring substrate 22. Thus, the separation and the removal between the metal base member 41 and the melting metal layer 43 can be properly performed.

On the other hand, the step of melting and removing the melting metal layer 43 uses the etching solution, which melts the melting metal layer 43 and does not melt the conductor pattern 35 (the conductor land 35A), and selectively removes only the melting metal layer 43 in step S18.

In this embodiment, the conductor pattern 35 is made of copper, and the melting metal layer 43 is made of chrome. Thus, for example, the usage of the etching solution of a hydrochloric acid group enables only the melting metal layer 43 to be melt and removed while the conductor pattern is left.

The multilayer wiring substrate 20 in this embodiment is manufactured as mentioned above. According to this embodiment, the first wiring substrate 21 and the second wiring substrate 22 are formed independently of each other. Finally, both of them are integrated through the adhesive material layer 23 into the single unit. Thus, the trouble that one step defect causes the entire multilayer wiring substrate to be defective is never induced. Hence, it is possible to attain the cost-cutting due to the usage of only confirming articles and the reduction in a tact time due to the parallel processing.

In addition, it is possible to solve the restriction on the material selection between the first wiring substrate 21 and the second wiring substrate 22. For example, if the conventional build-up process is used to try the formations of the first wiring substrate made of the glass epoxy resin and the second wiring substrate made of the PBO as described in this embodiment, the baking temperature of the PBO is high such as 300° C. Thus, it has the inconvenience that the first wiring substrate as the bedding can not endure the temperature. As a result, all of the insulating layers must be made of the PBO. In this embodiment, the PBO can be used only for the necessary layer. Hence, the further reduction in the manufacturing cost can be attained. At the same time, the substrate material suitable for the circuit property can be selected to thereby contribute to the higher function of the set.

In particular, this embodiment is designed so as to cut the second wiring substrate 22 to the pieces of the predetermined size and partially stack them on the necessary region on the first wiring substrate 21. Thus, the substrate material cost can be further reduced. Moreover, increasing the installation number of the second wiring substrates 22 can largely reduce the board manufacturing cost.

Also, this embodiment is designed such that the second wiring substrate 22 and the adhesive material layer 23 are supported by the supporting sheet 40 made of the metal, and with the supporting sheet 40 as the transfer sheet member, the second wiring substrate 22 and the adhesive material layer 23 are transferred onto the first wiring substrate 21. Thus, the dimensional stabilities of the adhesive material layer 23 and the second wiring substrate 22 relatively weak in rigid property or self-support property can be preserved to properly stack them on the first wiring substrate 21.

Moreover, the supporting sheet 40 is configured so as to include the metal base member 41 and the melting metal layer 43 separately stacked on this metal base member 41, and the removing operation for the supporting sheet 40 is constituted by the step of separating and removing the metal base member 41 from the melting metal layer 43 and the step of melting and removing the melting metal layer 43. Thus, the supporting sheet 40 can be removed properly and easily to thereby improve the productivity.

Second Embodiment

Figure 8:
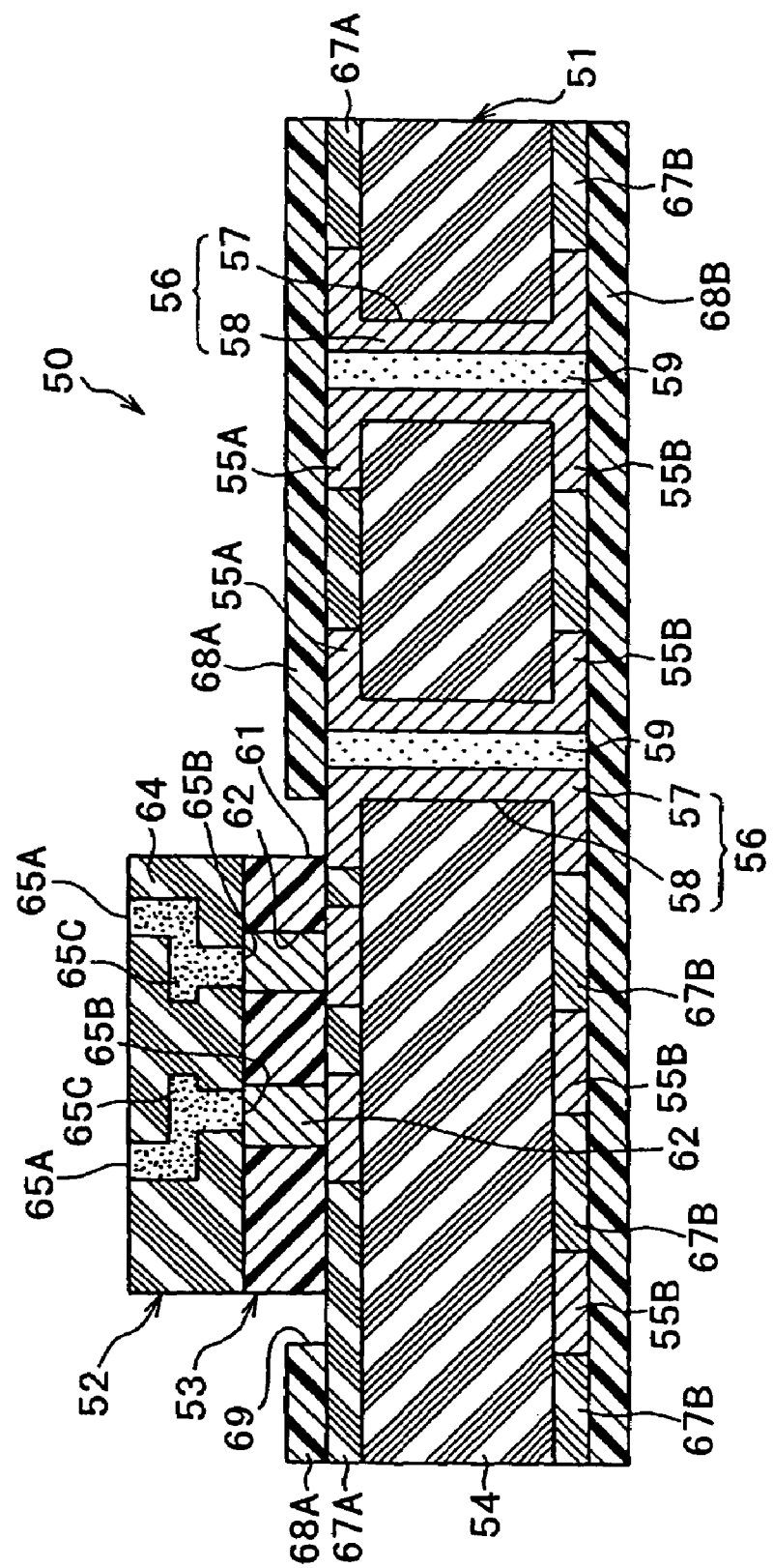
FIG. 8 is a sectional view diagrammatically showing a configuration of a main portion of a multilayer wiring substrate according to a second embodiment of the present invention.
Figure 9A:
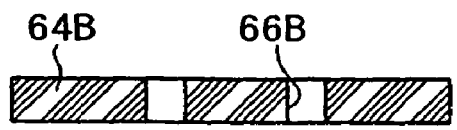
FIGS. 9A to 9G are sectional views explaining an example of a method of manufacturing a second wiring substrate in the multilayer wiring substrate in the second embodiment of the present invention at each step.
Figure 9B:
Figure 9C:
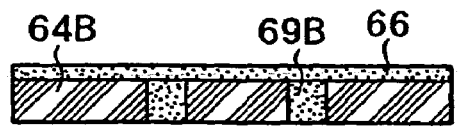
Figure 9D:
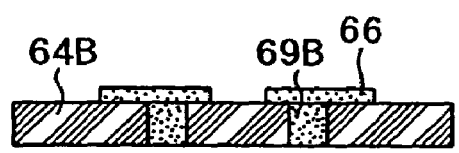
Figure 9E:
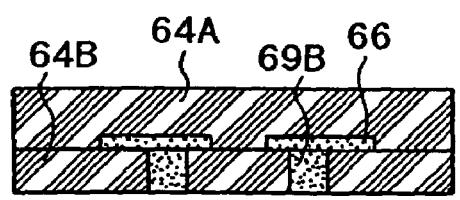
Figure 9F:
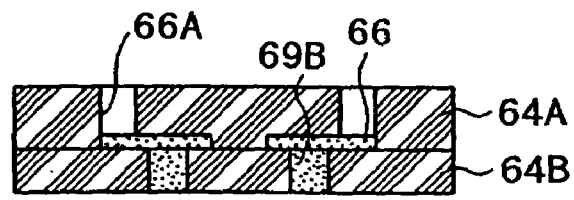
Figure 9G:
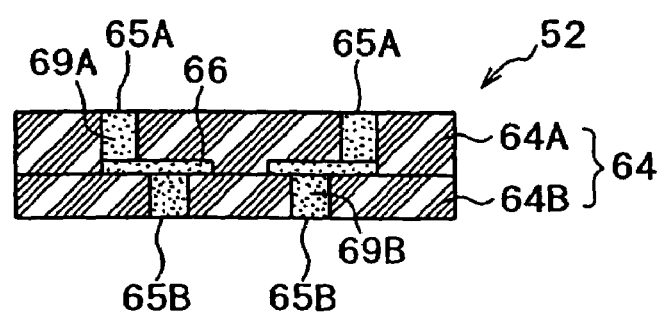

FIG. 8 shows the configuration of a multilayer wiring substrate according to a second embodiment of the present invention. A multilayer wiring substrate 50 in this embodiment is provided with a first wiring substrate 51, a second wiring substrate 52 and an adhesive material layer 53 placed between those first and second wiring substrates 51, 52.

The first wiring substrate 51 in this embodiment has the configuration similar to that of the first wiring substrate 21 explained in the first embodiment. It is made of the double-side copper-clad stack, and it includes: an insulator 54 serving as an insulating layer; and conductor patterns 55A, 55B (corresponds to a first conductor pattern of the present invention) formed by patterning the copper foils on the double sides to the predetermined shapes. By the way, the Ni/Au plating layers may be formed on the surface layers of the conductor patterns 55A, 55B.

The construction material of the insulator 54 is suitably selected depending on the application target, the use application and the like. For example, it is made of the organic material, such as the glass epoxy resin (the element in which the epoxy resin is impregnated in the fiber glass), the element in which the polyimide resin is impregnated in the fiber glass, the BT resin (Brand Name) in which the mixture of the bismale-imide-triazine resin and the epoxy resin is impregnated in the fiber glass, the element in which the phenol resin is impregnated in the paper, and the like. However, besides them, it can be made of the ceramic-based material, such as the alumina glass inclusion ceramics, the aluminum nitride and the like.

The conductor patterns 55A, 55B are partially electrically connected to each other via through-bores 56. The through-bore 56 is constituted by a through-bore 57 formed in the insulator 54 and a copper plating 58 formed on the inner wall plane thereof. By the way, a filing band 59 made of conductive material or non-conductive material is filled in the through-bore 56.

The regions in which the conductor patterns 55A, 55B on the top and bottom surfaces of the insulator 54 are not formed are covered with layers of insulating materials 57A, 57B, and the step on the insulator 54 caused by the formations of the conductor patterns 55A, 55B is removed. Consequently, the lamination plane of the first wiring substrate 51 is flattened to thereby preserve the proper lamination condition between it and the second wiring substrate 52.

On the other hand, the second wiring substrate 52 itself is configured as the multilayer substrate, and it has a conductor pattern (corresponds to a second conductor pattern of the present invention) 65. The conductor pattern 65 is composed of: conductor lands 65A, 65B exposed on the top and bottom surfaces of the insulator base material 64; and an inner wiring layer 65C through which they are connected. By the way, the Ni/Au plating layers may be formed on the surface layers of the conductor lands 65A, 65B.

As shown, the second wiring substrate 52 is formed smaller in area than the first wiring substrate 51. It is partially stacked on a predetermined portion on the first wiring substrate 51 through the adhesive material layer 53. Also in this embodiment, the above-mentioned predetermined portion designates the region required to be multilayered (higher wiring density) on the first wiring substrate 51.

The insulator base material 64 serving as the insulating layer is made of the material relatively strong in rigid property or self-support property, for example, the organic material, such as the glass epoxy resin (the element in which the epoxy resin is impregnated in the fiber glass), the element in which the polyimide resin is impregnated in the fiber glass, the BT resin (Brand Name) in which the mixture of the bismale-imide-triazine resin and the epoxy resin is impregnated in the fiber glass, the element in which the phenol resin is impregnated in the paper, and the like.

FIGS. 9A to 9G show an example of the process for manufacturing the second wiring substrate 52. The second wiring substrate 52 is formed, for example, by the conventional known build-up process and the like.

At first, a through-bore 66B is formed in a predetermined portion of the insulating layer 64B. Then, conductive material is filled therein to thereby form a via penetrating body 69B in FIGS. 9A, 9B. Moreover, a conductor layer 66 such as copper foil and the like is formed on a top surface of the insulating layer 64B, and this is patterned in FIGS. 9C, 9D. Next, the insulating layer 64A is formed on the insulating layer 64B, and a through-bore 66A linked to the conductor layer 66 is formed. Then, the conductive material is filled therein to form a via penetrating body 69A in FIGS. 9E, 9F and 9G. The inner wiring layer 65C is composed of the via penetrating bodies 69A, 69B and the conductor layer 66. The second wiring substrate 52 is formed as mentioned above.

Next, the adhesive material layer 53 is configured similarly to the adhesive material layer 23 explained in the first embodiment. It is composed of an interlayer insulating layer 61 made of photosensitive adhesive and a plurality of interlayer connections 62 formed at predetermined portions so as to penetrate this interlayer insulating layer.

Through the interlayer connection 62, the conductor pattern 55A of the first wiring substrate 51 and the conductor pattern 65 of the second wiring substrate 52 are linked correspondingly to each other. In this embodiment, the interlayer connection 62 is made of an electroplating layer of copper (Cu). However, besides this, it can be composed of other metals such as nickel (Ni), tin (Sn) and the like.

The multilayer wiring substrate 50 in this embodiment is configured as mentioned above. According to the multilayer wiring substrate 50 in this embodiment, the first wiring substrate 51 and the second wiring substrate 52 are configured so as to be stacked on each other through the adhesive material layer 53. Thus, although the respective insulators 54, 64 are made of the different materials, they can be easily stacked to thereby attain the multilayer.

Also, in the case of the multilayer wiring substrate 50 in this embodiment, as shown in FIG. 8, the second wiring substrate 52 is partially stacked on the predetermined region of the first wiring substrate 51. Thus, the multilayer can be formed only on the originally necessary region in the first wiring substrate 51. Consequently, the smaller area of the second wiring substrate 52 can be attained to thereby reduce the material cost. Moreover, the multilayer wiring substrate can be entirely lightened.

The method of manufacturing the multilayer wiring substrate 50 in this embodiment will be described below with reference to FIGS. 10A to 13. Here, FIGS. 10A to FIG. 12J are sectional views explaining the method of manufacturing the multilayer wiring substrate 50 at each step, and FIG. 13 is a process flowchart explaining the method of manufacturing the multilayer wiring substrate 50.

Figure 10A:
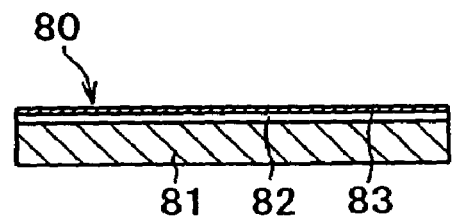

At first, a supporting sheet 80 having the configuration diagrammatically shown in FIG. 10A is prepared. The supporting sheet 80 has the configuration similar to that of the supporting sheet 40 explained in the first embodiment and provides the three-layer structure composed of: a metal base member 81 which is made of copper and has a thickness of, for example, about 100 μm; a conductive adhesive resin layer 82; and a melting metal layer 83 which is made of chrome (Cr) and has a thickness of, for example, 5 μm or less. The metal base member 81 and the melting metal layer 83 can be separated (stripped) from each other through the conductive adhesive resin layer 82.

By the way, the configuration example in which the metal base member 81 and the melting metal layer 83 are separated and removed from each other is not limited to the above-mentioned example. Other configuration examples can be employed. However, their detailed explanations will be described later.

Figure 10B:
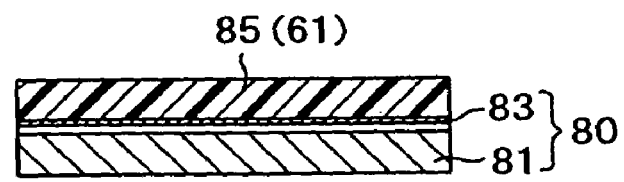
FIG. 10B shows a step of forming an adhesive layer.

Next, a photosensitive adhesive 85 is coated on the side surface of the melting metal layer 83 of the supporting sheet 80 in step S21 of FIG. 10B. The photosensitive adhesive 85 constitutes the interlayer insulating layer 61 of the adhesive material layer 53 through which the first wiring substrate 51 and the second wiring substrate 52 are adhered. By the way, the photosensitive adhesive 85 is not limited to the liquid type, and the sheet type may be used.

Figure 10C:
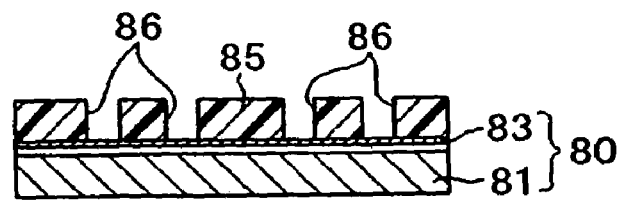
FIG. 10C shows a step of forming an interlayer connection.
Figure 10D:
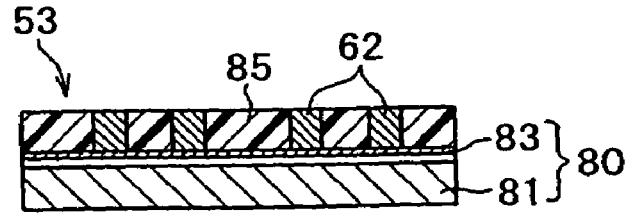
FIG. 10D shows a step of forming an interlayer connection.

After the photosensitive adhesive 85 is cured, the respective exposing and developing processes are carried out to thereby form a through-bore 86, as shown in FIG. 10C in step S22. Then, conductive material is filled in the formed through-bore 86 to thereby form the interlayer connection 62 in step S23 of FIG. 10D. The adhesive material layer 53 is formed as mentioned above.

The interlayer connection 62 in this embodiment is composed of the electroplating layer formed by the electroplating method that uses the supporting sheet 80 as a seeding layer (an electric power supplying layer). In this case, the photosensitive adhesive 85 functions as resist for plating. Consequently, the copper plating is deposited only on the region on which the photosensitive adhesive 85 of the supporting sheet 80 immersed in the plating bath is not coated. Thus, the conductive layer can be homogeneously formed on the insides of the respective through-bores 46 made at the micro pore size. Also, the interlayer connection 62 can be formed at the fine pitch.

By the way, also, this embodiment is not limited to the configuration that the interlayer connection 62 is entirely made of copper. For example, only the surface layer portion may be constituted by the electroplating layer of tin (Sn). Consequently, if the surface layer of the conductor pattern 55A (65) of the first (second) wiring substrate 51 (52) is a gold plating layer, the connection of lamination boundary can be done by Sn—Au junction. Thus, it is possible to attain the lower temperature and the smaller load of the stacking step.

Figure 11E:
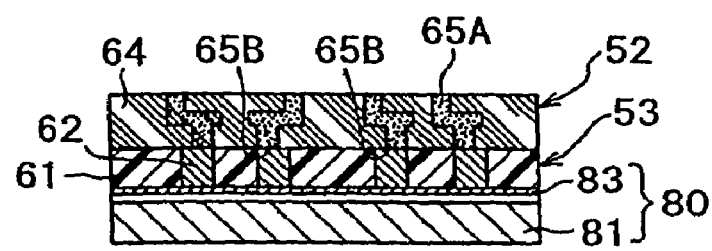
FIG. 11E shows a step of forming a second wiring substrate.

In succession, as shown in FIG. 11E, the previously formed second wiring substrate 52 is stacked on the adhesive material layer 53 on which the interlayer connections 62 are formed, and the interlayer connections 62 and the conductor pattern 65 are electrically connected in step S24.

Figure 11F:
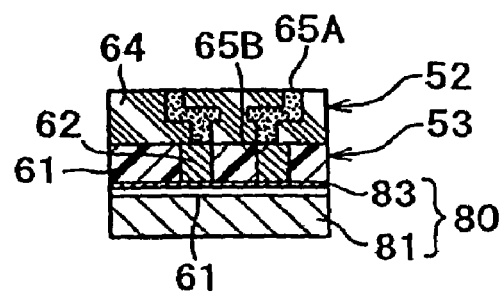
FIG. 11F shows a dicing step.

At a next dicing step, the second wiring substrate 52 together with the adhesive material layer 53 and the supporting sheet 80 is cut to the piece of the size corresponding to the lamination on the first wiring substrate 51 in step S25 of FIG. 11F.

Figure 11G:
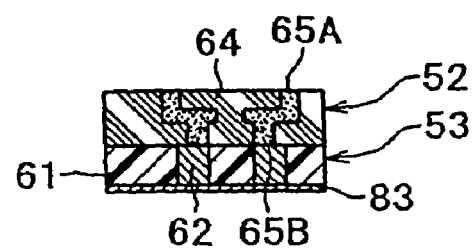
FIG. 11G shows a step of removing a supporting sheet.
Figure 12H:
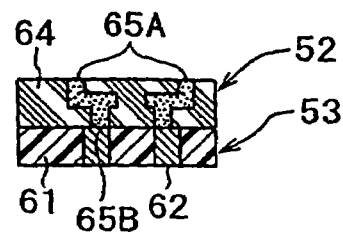
FIG. 12H shows a step of removing a supporting sheet.
Figure 13:
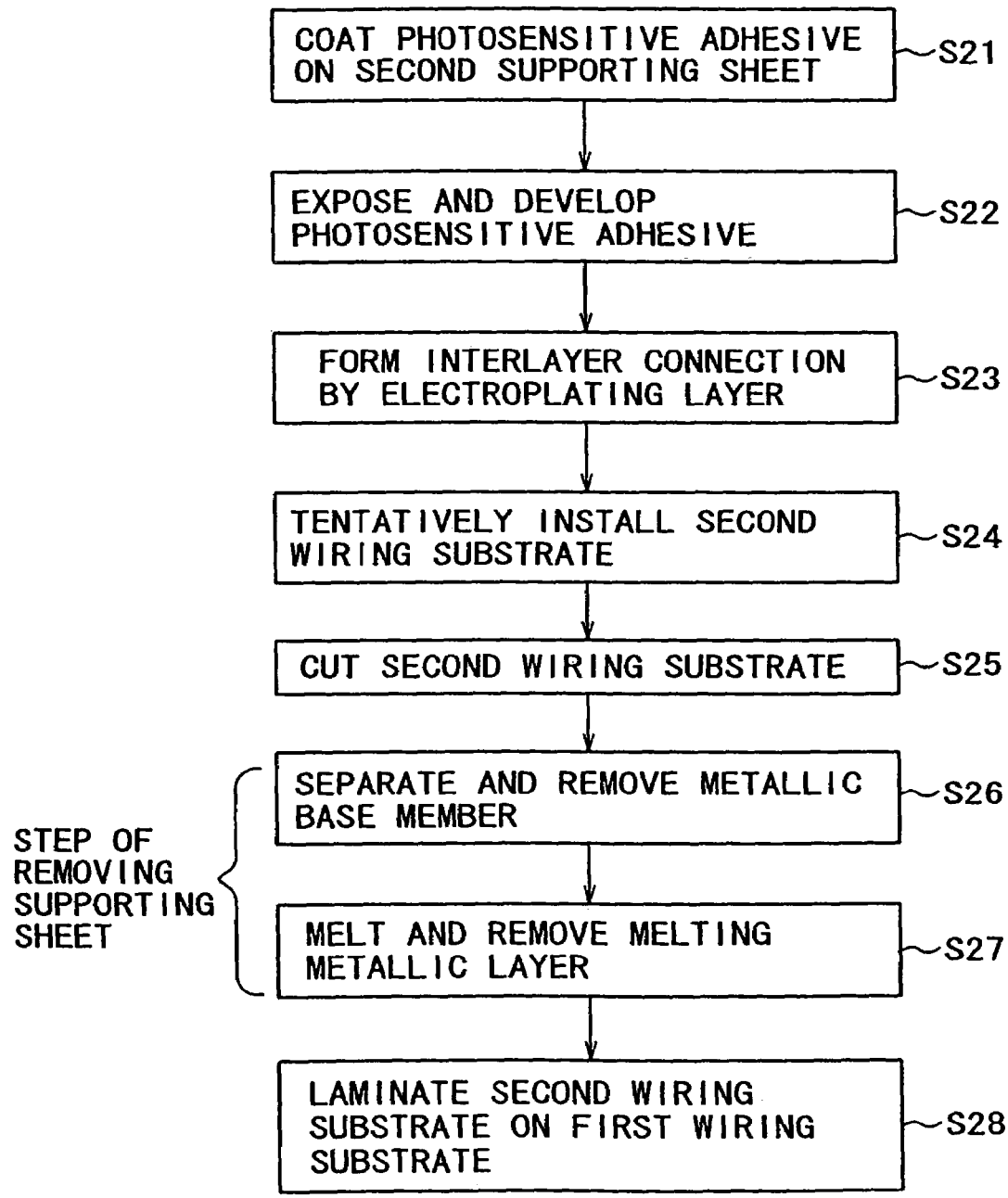
FIG. 13 is a flowchart explaining the method of manufacturing the multilayer wiring substrate in the second embodiment of the present invention.
Figure 15A:
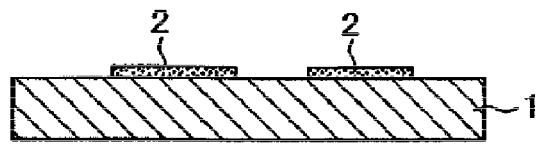
FIGS. 15A to 15E are sectional views explaining a conventional method of manufacturing a multilayer wiring substrate at each step.
Figure 15B:
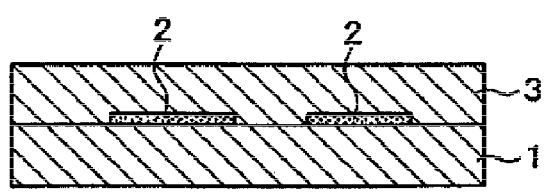
Figure 15C:
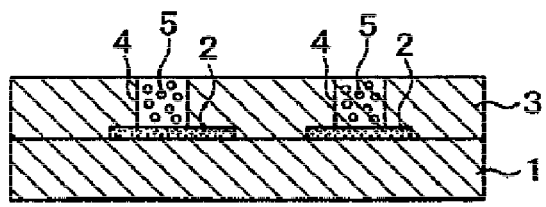
Figure 15D:
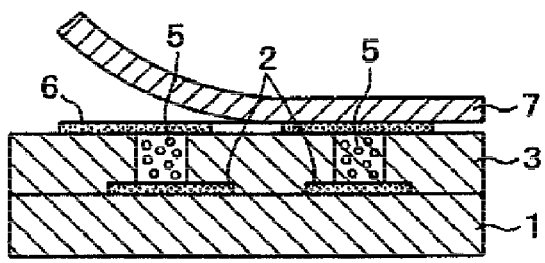
Figure 15E:
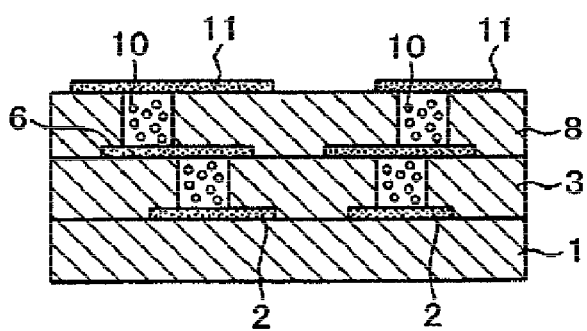

After that, as shown in FIGS. 11G, 12H, the step of removing the supporting sheet 80 from the adhesive material layer 53 is carried out in steps S26, 27. The removal of the supporting sheet 80 is constituted by a step of separating and removing the metal base member 81 from the melting metal layer 83 in step S26 of FIG. 11G and a step of melting and removing the melting metal layer 83 in step S27 of FIG. 12H.

With reference to FIGS. 11F, 11G, the step of separating and removing the metal base member 81 from the melting metal layer 83 is carried out by stripping the metal base member 81 from the melting metal layer 83 through the conductive adhesive resin layer 82 in step S26. By the way, in order to separate the conductive adhesive resin layer 82 together with the metal base member 81 from the melting metal layer 83, the mold releasing agent may be coated on a predetermined portion on the side surface of the melting metal layer 83.

The strip and the removal of the metal base member 81 can be easily done, for example, by inserting the notch for the stripping into the boundary between the melting metal layer 83 and the metal base member 81 at the edge of the supporting sheet 80. Also, during the process for stripping the metal base member 81, the melting metal layer 83 is supported by the adhesive material layer 53. Thus, the separation and the removal between the metal base member 81 and the melting metal layer 83 can be properly performed.

On the other hand, the step of melting and removing the melting metal layer 83 uses the etching solution, which melts the melting metal layer 83 and does not melt the interlayer connection 62, and selectively removes only the melting metal layer 83 in step S27 of FIG. 12H. Consequently, the supporting sheet 80 is properly removed from the adhesive material layer 53.

In this embodiment, the interlayer connection 62 is made of copper, and the melting metal layer 83 is made of chrome. Thus, for example, the usage of the etching solution of the hydrochloric acid group enables only the melting metal layer 83 to be melt and removed while the interlayer connection 62 is left.

Figure 12I:
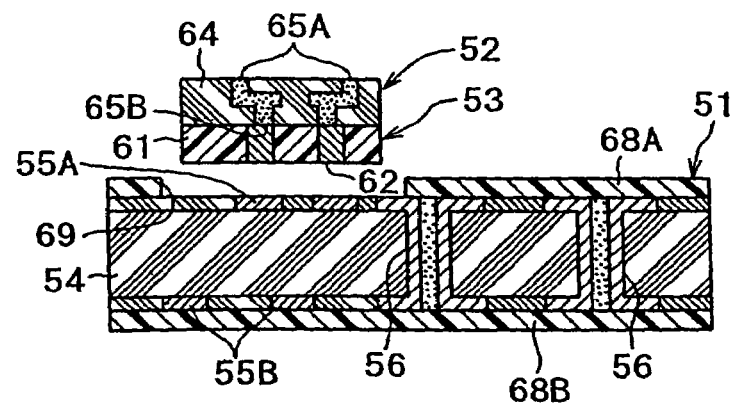
FIG. 12I shows a stacking step.
Figure 12J:
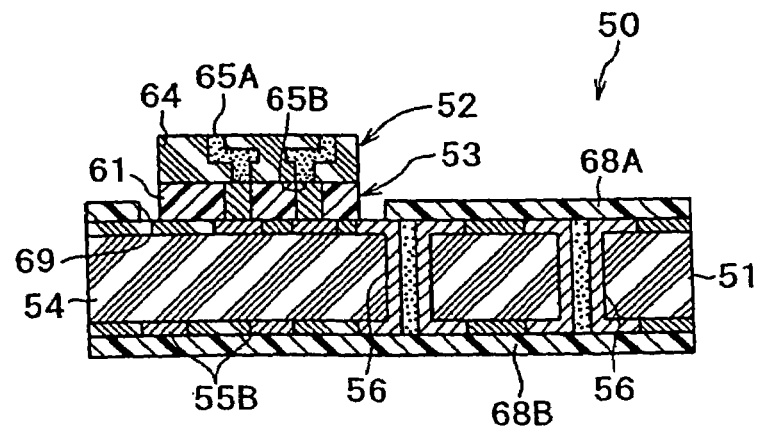

The second wiring substrate 52 is stacked on the predetermined portion of the first wiring substrate 51 through the adhesive material layer 53 from which the supporting sheet 80 is removed in step S28 of FIGS. 12I, 12J. The adhesive action between the first wiring substrate 51 and the second wiring substrate 52 is obtained by thermally curing the adhesive material layer 53 under predetermined heating and compressing operations.

Here, the insulator base material 64 constituting the second wiring substrate 52 is made of the material relatively strong in rigid property or self-support property. Thus, the dimensional variation in the interlayer connection 62 of the adhesive material layer 53 and the conductor land 65B can be suppressed at the time of the lamination on the first wiring substrate 51.

The multilayer wiring substrate 50 in this embodiment is manufactured as mentioned above. According to this embodiment, the first wiring substrate 51 and the second wiring substrate 52 are formed independently of each other. Finally, both of them are integrated through the adhesive material layer 53 into the single unit. Thus, the trouble that one step defect causes the entire multilayer wiring substrate to be defective is never induced. Hence, it is possible to attain the cost-cutting due to the usage of only the confirming articles and the reduction in the tact time due to the parallel processing.

In addition, it is possible to solve the restriction on the material selection between the first wiring substrate 51 and the second wiring substrate 52. Hence, the further reduction in the manufacturing cost can be attained. At the same time, the substrate material suitable for the circuit property can be selected to thereby contribute to the higher function of the set.

In particular, this embodiment is designed so as to cut the second wiring substrate 52 to the pieces of the predetermined size and partially stack them on the necessary region on the first wiring substrate 51. Thus, the substrate material cost can be further reduced. Moreover, increasing the installation number of the second wiring substrates 52 can largely reduce the board manufacturing cost.

On the other hand, this embodiment is designed such that the second wiring substrate 52 and the adhesive material layer 53 are supported by the supporting sheet 80 made of the metal immediately before the lamination on the first wiring substrate 51. The supporting sheet 80 is higher in strength than the conventional transfer sheet 7 (refer to FIGS. 15A to 15E) made of the resin film. Thus, at the time of the handling of the supporting sheet 80 required when the adhesive material layer 53 is formed and the second wiring substrate 52 is tentatively installed, it is possible to preserve the high dimensional stability of the formed adhesive material layer 53 and attain the high precise positioning to the second wiring substrate 52.

Moreover, the supporting sheet 80 is configured so as to include the metal base member 81 and the melting metal layer 83 separately stacked on this metal base member 81, and the removing operation for the supporting sheet 80 is constituted by the step of separating and removing the metal base member 81 from the melting metal layer 83 and the step of melting and removing the melting metal layer 83. Thus, the supporting sheet 80 can be removed properly and easily. Hence, the conductor pattern can be formed at the high precision, and the productivity can be improved.

As mentioned above, the respective embodiments of the present invention is explained. Of course, the present invention is not limited to them. Various variations can be carried out, in accordance with the technical idea of the present invention.

For example, the above-mentioned embodiments are designed such that as the supporting sheets 40, 80, as shown in FIGS. 4A, 10A, the conductive adhesive resin layers 42, 82 are placed between the metal base members 41, 81 and the melting metal layers 43, 83, and the metal base members 41, 81 and the melting metal layers 43, 83 can be separated from each other. However, the configuration of the supporting sheets 40, 80 is not limited thereto. If the metal base member and the melting metal layer can be configured so as to be separated from each other, any configuration can be employed.

For example, a supporting sheet 101 whose sectional structure is shown in FIG. 14A is configured such that a middle layer 103 made of chrome-plated material is placed between a metal base member 102 made of copper and a melting metal layer 104 made of nickel-plated material, and the usage of plating stress difference causes the melting metal layer (Ni) 104 and the middle layer (Cr) 103 to be stripped on the boundary. At the step of melting and removing the melting metal layer (Ni) 104 after the removal of the metal base member 102 and the middle layer 103, if the conductor portion (the interlayer connection 32 and the conductor land 65A) integrated with it is made of copper, for example, the etching solution of a sulfasion hydrogen peroxide group may be used.

Also, in FIG. 14A, if the middle layer 103 is made of chrome-plated material and if the melting metal layer 104 is made of nickel-cobalt-plated material, respectively, the respective layers 103, 104 can be easily separated on the boundary between them. In this case, at the step of melting and removing the melting metal layer (Ni/Co) 104, the conductor portion (the interlayer connection 32 and the conductor land 65A) integrated with it is made of copper, for example, soft etching agent in which sulfasion hydrogen peroxide is used as a base can be applied.

Also, the above-mentioned respective embodiments are explained by using the example in which the removal of the supporting sheets 40, 80 is constituted by the step of separating and removing the metal base members 41, 81 and the step of melting and removing the melting metal layers 43, 83. Instead of that example, the entire supporting sheets may be melted and removed. In this case, the case in which the supporting sheets are made of the same metal is naturally allowable, and the case in which they are constituted by the lamination bodies made of different metals is allowable. In particular, in the latter case, the different etching solutions may be used to selectively etch the respective metal layers.

For example, FIG. 14B shows the configuration of a supporting sheet 111 composed of first and second metal layers 112, 114 different from each other. Here, if the first metal layer 112 is made of copper and the second metal layer 114 is made of nickel, the usage of alkali etchant enables only the first metal layer (Cu) 112 to be etched. Similarly, if the first metal layer 112 is made of copper and the second metal layer 114 is made of aluminum, the usage of sulfuric acid hot water as etching solution enables only the first metal layer (Cu) 112 to be etched. In addition, as the combination example of the first and second metal layers 112, 114, there are the combination of nickel and gold and the combination of copper and chrome.

Also, those combination examples of the different metals can be applied as the combination example between the configuration metals of the melting metal layers 43, 83 and the configuration metals of the conductor patterns (the interlayer connection 32 and the conductor land 65A).

Moreover, the supporting sheet may be composed of the two layers of the metal base member and the melting metal layer, and those respective layers may be separated depending on the difference in the thermal expansion coefficient between the respective layers. Or, as shown in a supporting sheet 121 in FIG. 14C, a thermally expanding layer 123 is placed between a metal base member 122 and a melting metal layer 124. Then, a heating process to a predetermined temperature may be carried out to expand the thermally expanding layer 123 and thereby separate the metal base member 122 and the melting metal layer 124.

On the other hand, in the above-mentioned respective embodiments, the metal base members 41, 81 of the supporting sheets 40, 80 are made of copper. However, they are not limited thereto. That is, if the material can satisfy the mechanical strength, the thermal expansion coefficient and the like which are required depending on the forming process condition and the lamination condition of the supported wiring substrate and the like, any material can be applied.

Also, the interlayer connections 32, 62 of the adhesive layers 23, 53 are constituted by the electroplating layer. Instead of it, the interlayer connection may be formed by filling conductive particles, for example, such as solder and the like, in the through-bores 31A, 86.

Moreover, the above-mentioned respective embodiments have been explained by exemplifying the lamination of the first and second two wiring substrates. Of course, the present invention is not limited thereto. The present invention can be applied to even the case in which first to n-th of n wiring substrates are stacked to obtain the multilayer.

As mentioned above, according to the method of manufacturing the multilayer wiring substrate in the present invention, even if the first and second wiring substrates are made of the different materials, they can be stacked on each other through the adhesive layer. Thus, it is possible to solve the restriction on the process resulting from the material selection.

Also, the second wiring substrate is stacked on the predetermined portion of the first wiring substrate. Thus, the second wiring substrate can be formed smaller in area than the first wiring substrate. Hence, the material cost can be reduced.

Moreover, the supporting sheet for supporting the second wiring substrate is made of the metal. Thus, the dimensional stability of the interlayer connection and the second conductor pattern formed at the fine pitch can be preserved to properly stack on the first wiring substrate.

On the other hand, according to the multilayer wiring substrate of the present invention, the second wiring substrate can be formed smaller in area than the first wiring substrate. Thus, as compared with the case in which the second wiring substrate is formed on the entire surface of the first wiring substrate, the usage amount of the construction material of the second wiring substrate can be reduced to thereby reduce the material cost. Moreover, the multilayer wiring substrate can be entirely weight saving.

What is claimed is:

1. A method of manufacturing a multilayer wiring substrate, including the steps of: providing a first wiring substrate having a first conductor pattern;

forming a second wiring substrate having a second conductor pattern therein on a supporting sheet made of metal;

forming an adhesive layer on said formed second wiring substrate;

forming an interlayer connection in the adhesive layer, said the interlayer connection electrically linked to said second conductor pattern;

stacking said second wiring substrate through said adhesive layer on a predetermined region of said first wiring substrate, and electrically connecting said interlayer connection and said first conductor pattern;

removing said supporting sheet from said second wiring substrate, and further wherein said supporting sheet is comprised of a metal base member and a melting metal layer on which said second wiring substrate is formed and which is separately stacked on said metal base member, and the step of removing said supporting sheet includes a step of separating and removing said metal base member from said melting metal layer and a step of selectively melting and removing only said melting metal layer from said second wiring substrate containing said second conductor pattern.

2. The method of manufacturing a multilayer wiring substrate according to claim 1, wherein said melting metal layer and said second conductor pattern are made of metal materials different from each other, and the step of melting and removing said melting metal layer is carried out by using an etching solution which melts said melting metal layer and does not melt said second conductor pattern.

3. The method of manufacturing a multilayer wiring substrate according to claim 1, wherein a photosensitive adhesive is used as said adhesive layer, and said interlayer connection is formed by an electroplating method that uses said photosensitive adhesive as a resist for plating.

4. The method of manufacturing a multilayer wiring substrate according to claim 1, further including a step of:

a step of cutting said second wiring substrate together with said supporting sheet to a piece of a predetermined shape before a step of stacking said second wiring substrate and said first wiring substrate.

5. The method of manufacturing a multilayer wiring substrate according to claim 1, wherein an insulating layer of said first wiring substrate and an insulating layer of said second wiring substrate are made of materials different from each other.

6. The method of manufacturing a multilayer wiring substrate according to claim 1, further including a step of:

flattening a surface on said first wiring substrate by coating an insulating material on a region in which said first conductor pattern on said first wiring substrate is not formed, before the step of stacking said second wiring substrate on said first wiring substrate.

* * * * *